United States Patent [19]

Adamec et al.

[11] Patent Number: 5,621,603
[45] Date of Patent: Apr. 15, 1997

[54] PULSE WIDTH MODULATED SOLENOID DRIVER CONTROLLER

[75] Inventors: William B. Adamec, West Newton, Mass.; Ronald J. Columbus; James A. Gosse, both of Tolland, Conn.; David J. Johnston, Chelmsford, Mass.; Steven V. Leone, Jacksonville Beach, Fla.; Francesco Servidone, Newington, Conn.

[73] Assignee: United Technologies Corporation, Hartford, Conn.

[21] Appl. No.: 506,935

[22] Filed: Jul. 26, 1995

[51] Int. Cl.$^6$ .................................................. H01H 47/32
[52] U.S. Cl. ........................................ 361/154; 361/187
[58] Field of Search .................................... 361/152–154, 361/160, 187; 307/131; 324/417, 420, 422, 423

[56] References Cited

U.S. PATENT DOCUMENTS

| | | |
|---|---|---|
| 4,381,532 | 4/1983 | Arnold . |
| 4,546,403 | 10/1985 | Nielsen . |
| 4,556,926 | 12/1985 | Yanagida . |
| 4,764,840 | 8/1988 | Petrie et al. . |
| 4,949,215 | 8/1990 | Studmann et al. . |
| 4,978,865 | 12/1990 | Hartmann et al. ...................... 361/154 |
| 5,182,517 | 1/1993 | Thelen et al. . |
| 5,195,011 | 3/1993 | Giorgetta et al. . |
| 5,345,181 | 9/1994 | Mantani et al. . |
| 5,438,489 | 8/1995 | Judy et al. ............................. 361/160 |
| 5,490,031 | 2/1996 | Braun et al. ........................... 361/154 |
| 5,499,157 | 3/1996 | Younessi et al. ...................... 361/191 |
| 5,541,806 | 7/1996 | Hoffman ................................ 361/154 |

Primary Examiner—Fritz Fleming
Attorney, Agent, or Firm—Richard H. Kosakowski, Esq.; Holland & Bonzagni, P.C.

[57] ABSTRACT

Electronic drive circuitry for a solenoid that utilizes a pulse width modulation scheme is disclosed. The solenoid is connected in series with a transistor and a sense resistor. The voltage across the sense resistor is compared to a reference value to determine if an over-current condition exists within the solenoid. The circuitry operates on a repetitive time window scheme in which current is allowed to flow through the solenoid at the beginning of each time window, regardless of whether an over-current condition exists. If an over-current condition was detected at any time during the time window, then the current will be shut off to the solenoid during the next time window after the initial portion of that window. Conversely, if no over-current condition was detected during a time window, current will be allowed to flow during the entire duration of the next time window. Wraparound circuitry is also provided for sensing an open-coil condition during a latter portion of one of the time windows after a plurality of such windows has elapsed.

9 Claims, 1 Drawing Sheet

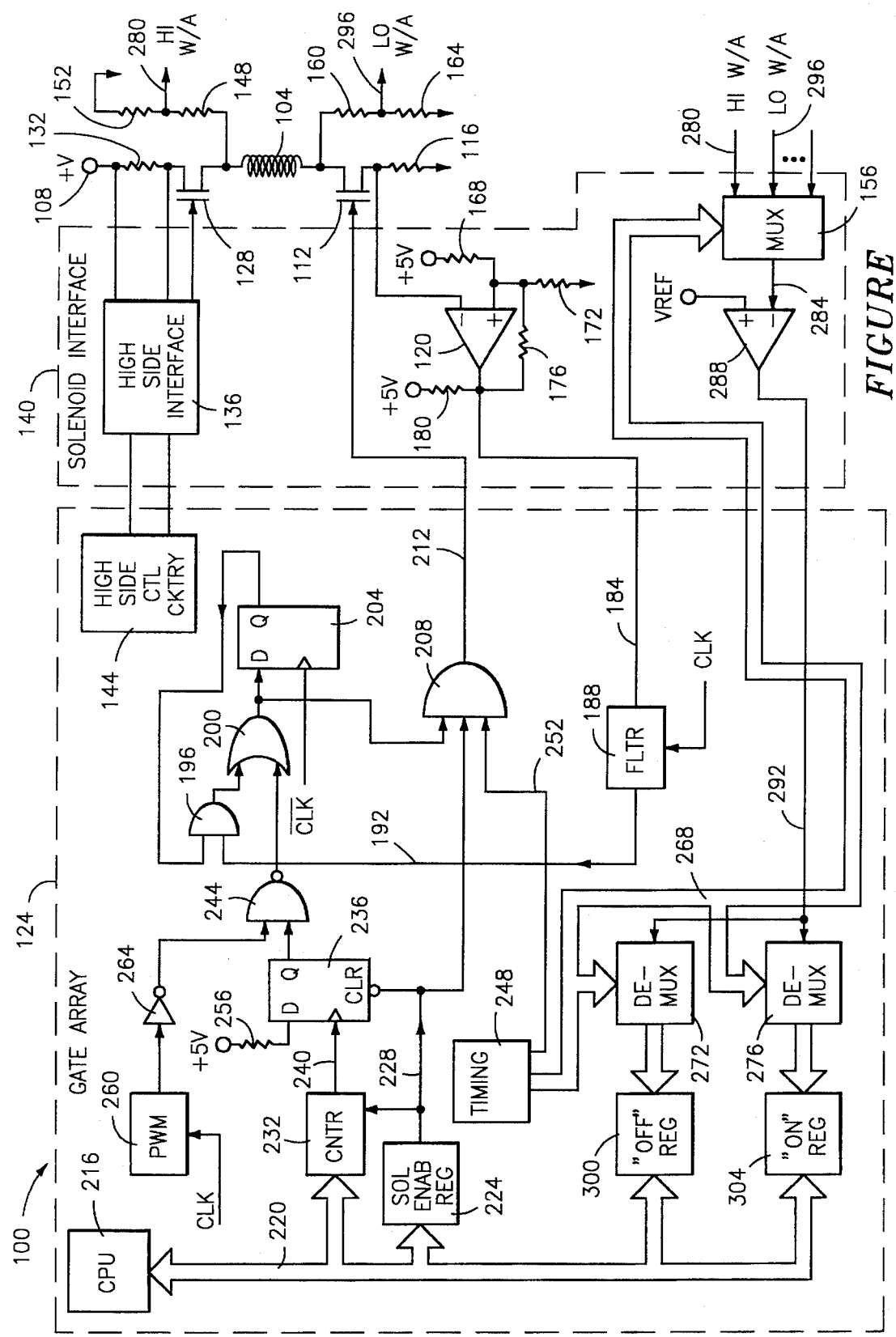

PULSE WIDTH MODULATED SOLENOID DRIVER CONTROLLER

BACKGROUND OF THE INVENTION

This invention relates to electronic drive circuits for solenoids, and more particularly to such an electronic drive circuit that utilizes a pulse width modulated technique.

A solenoid is an electromechanical device that transduces or changes an electrical signal, which is input to the wire coil of the solenoid, into a corresponding mechanical movement of a metallic device, such as a rod, disposed within the coil. The electrical current flowing through the wire coil creates a magnetic field that either attracts or repels the metallic device. The metallic device is typically connected to a mechanical device, such as an actuator, which is physically moved along with the metallic device of the solenoid by the magnetic field.

Solenoids are commonly used in a wide range of both commercial and military devices. For example, solenoids are used on aircraft to control various mechanical devices and variables.

Various electronic circuits are used for driving or controlling the solenoid coil. See, for example, U.S. Pat. Nos. 4,381,532, 4,546,403, 4,556,926, 4,764,840, 4,949,215 and 5,345,181. A typical circuit comprises a solenoid being connected in series with a supply voltage, a transistor and a sense resistor. The voltage across the sense resistor is indicative of the current flowing through the solenoid coil. It is usually required to control the current through the solenoid such that it does not exceed a certain value, else the solenoid would fail.

The voltage across the sense resistor is typically fed to one input of a comparator, the other input of which is fed a reference voltage. If the sense resistor voltage exceeds the reference voltage, the comparator output toggles or switches state. Subsequent signal processing circuitry downstream from the comparator controls the switching of the transistor in series with the solenoid to its off state. This prevents an over-current condition in the solenoid coil.

Accordingly, it is a primary object of the present invention to provide an electronic drive or control circuit for a solenoid, the circuit utilizing a pulse width modulated scheme.

It is a general object of the present invention to limit the electrical current flowing in a solenoid coil to a predetermined maximum value that allows for proper solenoid operation.

It is another object of the present invention to sense an open coil condition of the solenoid.

It is yet another object of the present invention to utilize a pulse width modulated scheme for driving a solenoid such that the scheme operates on repetitive time periods or windows, with the solenoid coil having a current applied thereto for a portion of each window, regardless of whether or not an over-current condition exists in the solenoid.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicants have invented a pulse width modulated electronic drive circuit for a solenoid.

In a preferred embodiment, the wire coil of the solenoid is connected in series with a voltage supply, a first transistor and a first sense resistor. The first transistor and the first sense resistor are connected to the low side of the solenoid coil. A second transistor and a second sense resistor, together with associated solenoid over-current circuitry, are connected to the high side of the solenoid coil. The current through the solenoid coil is sensed as a corresponding voltage across the first sense resistor. A comparator compares this voltage to a reference voltage whose value is indicative of an over-current condition in the solenoid. If the voltage across the sense resistor exceeds the reference voltage, a solenoid over-current condition exists. The first transistor will then be shut off, thereby removing the voltage supply from the solenoid until the solenoid current drops below the over-current level.

A repeating periodic time window scheme is utilized wherein the solenoid always has voltage applied thereto during the first 25 percent of the window period, regardless of whether an over-current condition exists. During the last 75 percent of the window period, the voltage is applied to the solenoid if no over-current condition existed during the previous window period. In the alternative, the voltage is not applied if an over-current condition existed in the previous window period. Near the end of a predetermined number of window periods, the voltage is not applied across the solenoid for a certain period of time, and a check is made for an open solenoid coil. This check is performed by comparing a voltage at one end of the solenoid coil to a reference voltage indicative of an open-coil condition. If an open coil condition exists, the output of a comparator toggles its state and subsequent signal processing circuitry prevents any further current from being applied to the solenoid coil. Also, at some arbitrary time during an application of the voltage to the solenoid coil, a check for proper solenoid voltage is carried out.

BRIEF DESCRIPTION OF THE DRAWINGS

The sole FIGURE is a schematic diagram illustration of electronic drive circuitry that implements a pulse width modulated scheme in controlling the current through a solenoid, in accordance with the present invention.

DETAILED DESCRIPTION OF THE PREFERRED EMBODIMENTS

Referring to the sole FIGURE in detail, a preferred embodiment of an electronic drive circuit for a solenoid in accordance with the present invention is illustrated therein and generally designated by the reference numeral 100. The solenoid coil 104 is connected in series with a voltage supply 108, a first transistor 112, and a first sense resistor 116. The voltage across the sense resistor 116 is indicative of the current through the solenoid 104. This voltage is fed to a comparator 120 that compares the voltage to a reference voltage and an over-current condition exists if the voltage across the sense resistor 116 exceeds the reference voltage. The output of the comparator 120 is then provided to subsequent signal processing circuitry within a gate array integrated circuit 124. This gate array circuitry turns off the first transistor 112, thereby preventing any current flow through the solenoid 104.

The first transistor 112 has a pair of output terminals, one of which is connected to the low end or side of the solenoid coil 104, while the other output terminal is connected to one side of the first sense resistor 116. The other side of the first sense resistor 116 is connected to electrical ground. The upper end of the solenoid 104 connects to one of a pair of output terminals of a second transistor 128, the other output terminal of the transistor 128 being connected to a second sense resistor 132. The upper side of the second sense resistor 132 is connected to the voltage supply 108. A gate terminal of the second transistor 128, together with both sides of the second sense resistor 132, are connected to high side solenoid interface circuitry 136 disposed within a solenoid interface integrated circuit 140. The high side interface circuitry 136 also connects with high side control circuitry 144 disposed within the gate array 124. Both the high side interface circuitry 136 and the high side control circuitry 144 are described in greater detail hereinafter.

The upper side of the solenoid 104 also connects in series to a pair of resistors 148, 152. The mid-point of these two resistors 148, 152 is connected to one input of a multiplexer 156 within the solenoid interface circuitry 140. Also, the lower end of the solenoid 104 connects to a similar series connection of a pair of resistors 160, 164. The mid-point between these two resistors 160, 164 connects to a second input of the multiplexer 156. The two resistor networks 148, 152, 160, 164, the solenoid 104, the two transistors 112, 128, the two sense resistors 116, 132 and the voltage supply 108 may be located external to the solenoid interface circuitry 140. Further, the solenoid interface circuitry 140 may be disposed on an integrated circuit that is separate from the gate array integrated circuit 124. However, it is to be understood that the arrangement of all of the components illustrated in the FIGURE on one or more integrated circuits is purely exemplary.

The magnitude of the voltage at the node or connection point between one of the output terminals of the first transistor 112 and the first sense resistor 116 is proportional to the amount of electrical current flowing through the solenoid coil 104. This voltage is provided to the inverting input of an operational amplifier configured as a comparator 120. The non-inverting input of the comparator 120 has a fixed reference voltage applied thereto from a resistor divider network comprised of a pair of resistors 168, 172. This reference voltage is indicative of an over-current condition through the solenoid coil 104. A resistor 176 is connected between the non-inverting input of the comparator 120 and the output of the comparator 120. Also, a pull-up resistor 180 connects to the comparator output.

As long as the current through the solenoid 104 remains below its over-current level, the voltage at the non-inverting input of the comparator 120 will exceed the voltage at the inverting input of the comparator 120 and the output of the comparator 120 will be a logic HI. On the other hand, if an over-current condition exists, the voltage at the inverting input will exceed the voltage at the non-inverting input, and the comparator output will toggle or switch to its logic LO state.

The output of the comparator 120 on a signal line 184 is fed to a filter circuit 188 within the gate array 124. The filter 188 implements a hysteresis function by requiring that the comparator output signal 184 remain at one of its two logic states for a predetermined number of clock cycles. To accomplish this, a clock signal of approximately 1.25 MHz ("CLK") is applied to the filter circuit 188. The resulting time period of each clock signal pulse is approximately 0.8 microseconds. In an exemplary embodiment, the output state of the comparator must remain the same for at least three clock cycles, or 2.4 microseconds, for that new logic state to initially be considered by the filter 188 to pass through to the filter output on a signal line 192. Then, if the comparator output signal 184 remains at that same logic state for an additional two clock cycles, or 1.6 microseconds (for a total of 4.0 microseconds), this new comparator output logic state will pass through the filter circuitry 188 on to the filter output on the signal line 192. Thus, the filter circuitry 188 implements a hysteresis band of approximately two clock cycles, or 1.6 microseconds.

In a preferred embodiment, the filter 188 is a "one-way" filter in that the hysteresis band is only implemented when the logic state of the comparator output signal 184 indicates that current is flowing through the solenoid 104 and then the logic state flips to an over-current condition. That is, the hysteresis band implemented by the filter 188 is only operable during over-current conditions. It is not operable when firstly no current flows through the solenoid 104 and secondly then current flows through the solenoid 104 such that the output of the comparator 120 toggles from a logic LO to a logic HI. Such change of logic state will be passed directly through the filter circuitry 188 to the filter output line 192. However, it is to be understood that, if desired, the filter 188 may be implemented as a "two-way" filter such that a hysteresis band is utilized upon current beginning to flow through the solenoid 104.

The logic state at the output of the filter 188 on the line 192 is fed to one input of a two-input AND gate 196. The output of the AND gate 196 is fed to one input of a two-input OR gate 200. The output of the OR gate 200 is fed to the data or "D" input of a first flip-flop 204. The Q output of the first flip-flop 204 connects to the second input of the two-input AND gate 196. The first flip-flop 204 is a leading-edge-triggered flip-flop that is clocked by the inverse of the clock signal, i.e., CLK/. The output of the two-input OR gate 200 also connects to one input of a three-input AND gate 208. The output of this three-input AND gate 208 connects on a line 212 to the gate terminal of the first transistor 112.

For current to flow through the solenoid 104, the first transistor 112 must be turned on. Thus, the voltage at the gate terminal of the first transistor 112 must be at a logic HI. In order for the output of the three-input AND gate 208 to be simultaneously at a logic HI, the three inputs of the three-input AND gate 208 must all be simultaneously at a logic HI. The circuitry implementing these three inputs connected to the three-input AND gate 208 will now be explained.

The gate array 124 contains a central processing unit ("CPU") 216 that controls a number of functions of the electronic drive circuitry 100 of the present invention. The CPU 216 connects by a bus 220 to various components, one of which is a solenoid enable register 224. The bus 220 represents a plurality of signal lines, including address, data and control lines.

The solenoid enable register 224 is a multiple-bit register, with each bit being dedicated to one of the solenoids 104 and associated types of circuitry illustrated in the FIGURE. It is to be understood that, although not shown, a majority of the circuitry 100 illustrated in the sole FIGURE may be duplicated a number of times, one for each solenoid 104 that is to be controlled in accordance with the circuitry 100 of the present invention. The solenoid enable register 224 can be both written to and read by the CPU 216. When the CPU 216 desires to implement the pulse width modulated scheme of the present invention, the CPU 216 writes a logic HI to the appropriate bit of the solenoid enable register 224 for the particular solenoid 104 to be controlled. On the other hand, when it is desired to operate the solenoid 104 in other than the pulse width modulated mode (for example, in a DC operating mode), the CPU 216 writes a logic LO to the appropriate bit of the solenoid enable register 224. This bit is passed through on the signal line 228 at the output of the solenoid enable register 224 to the middle input of the three-input AND gate 208. Thus, the bit of the solenoid enable register 224 must be at a logic HI for the pulse width modulated scheme of the present invention to be utilized.

The output from the solenoid enable register 224 on the line 228 is also fed to an enable input of a counter 232. The counter 232 also connects to the bus 220 of the CPU 216. The counter 232 turns the solenoid 104 on upon power-up of the overall circuitry 100 of the sole FIGURE, or upon reset of power of the circuitry 100.

Initially, upon power-up of the circuitry 100, or power reset, the CPU 216 writes a logic LO to the appropriate bit in the solenoid enable register 224. Since the output line 228 of this register 224 is connected to the clear ("CLR") input of a second flip-flop 236, the Q output of that flip-flop 236 is also at a logic LO. This "resets" the second flip-flop 236. Then, the CPU 216 writes a logic HI to that bit of the solenoid enable register 224. This enables the counter 232 to begin counting down from an initial value that is programmable by the CPU 216 over the bus 220. In an exemplary embodiment, the counter 232 counts down for a total of 512 milliseconds (with 8 milliseconds granularity), during which time the output of the counter 232 on a line 240 is a logic LO. The counter output on the line 240 is fed to the clock input of the second flip-flop 236. Throughout the time period that the counter 232 is counting down, the Q output of the second flip-flop 236 remains at a logic LO. The Q output of the second flip-flop 236 connects to one input of a two-input NAND gate 244. The output of the two-input NAND gate 244 is fed to one input of the two-input OR gate 200. A logic LO at that input of the two-input NAND gate 244 will force its output to a logic HI, which also forces the output of the OR gate 200 to a logic HI.

At the same time, a timing circuit 248, which may be implemented as a known state machine, provides a signal on a line 252 to the third input of the three-input AND gate 208. During the time that the counter 232 is counting down, the timing circuit 248 provides a logic HI on the signal line 252 to the third input of the AND gate 208.

Thus, it can be seen from the foregoing that while the counter 232 is counting down for a period of 512 milliseconds, the first transistor 112 is turned on, thereby allowing current to flow through the solenoid coil 104. Typically, this initial on-time period corresponds to the minimum time that the solenoid 104 must be turned on to ensure "pull-in" of the solenoid 104. However, since the counter 232 is programmable by the CPU 216 over the bus 220, the counter 232 may be set to any desired value, as long as that value chosen is sufficient in time to allow the solenoid 104 to pull-in.

At the end of this 512 millisecond time period, the counter 232 counts out, and the output of the counter 232 on the line 240 toggles to a logic HI state. Since the second flip-flop 236 is a leading-edge-triggered device, the transition of the counter output signal 240 from a logic LO to a logic HI causes the logic state at the Q output of the second flip-flop 236 to toggle from a logic LO to a logic HI, since the data or D input of the flip-flop 236 is pulled up through a resistor 256 to a logic HI level (i.e., +5 V). At this point in time, the solenoid 104 has been "pulled-in" and normal operation of the circuitry 100 of the present invention can commence.

During normal operation, the circuitry 100 of the present invention implements a pulse width modulated scheme that is operable over the plurality of repetitive time periods or "windows". In a preferred, yet exemplary, embodiment, each window has a duration of 160 microseconds. For the first 25 percent, or 40 microseconds of each window, the solenoid coil 104 has a current flowing through it, regardless of whether an over-current condition exists. Whether current flows through the remaining 75 percent, or 120 microseconds, of each 160 microsecond window is determined by whether an over-current condition was detected at any time during the prior 160 microsecond window.

The circuitry 100 of the present invention implements this repetitive time period pulse width modulation scheme by utilizing a PWM counter 260 that is fed by the clock signal. The PWM counter 260 begins counting down at the beginning of each repetitive time window. The PWM counter 260 has an exemplary count duration of 40 microseconds. While the counter 260 is counting down, the output of the counter is a logic HI. The counter output is fed to an inverter 264, which causes the logic HI output of the PWM counter 260 to be a logic LO during the time that the PWM counter 260 is counting down. The output of the inverter 264 is fed to a second input of the two-input NAND gate 244. A logic LO on this input causes the output of the two-input NAND 244 gate to be at a logic HI, regardless of the logic state at the second input of the NAND gate 244. This logic HI at the output of the NAND gate 244 causes the output of the two-input OR gate 200 to be at a logic HI. Since the output of the OR gate 200 is fed to one input of the three-input AND gate 208, the first transistor 112 is turned on during this 40 microsecond time period at the start of each 160 microsecond window. This allows current to flow through the solenoid 104 during this time period.

Once the PWM counter 260 has counted out at the end of the 40 microsecond period, the output of the PWM counter 260 toggles to a logic LO. Then, the output of the inverter 264 is a logic HI. Since both inputs of the two-input NAND gate 244 are a logic HI, the output of the NAND gate 244 is a logic LO.

Since one input of the two-input OR gate 200 is a logic LO, whether the output of this OR gate 200 is a logic HI depends on the logic level at its other input. As described hereinbefore, this second input of the OR gate 200 is fed from the output of the two-input AND gate 196, one of whose inputs is fed from the filter circuitry 188. The other input of the AND gate 196 is fed from the Q output of the first flip-flop 204.

Thus, the second input of the OR gate 200 will only be a logic HI if an over-current condition does not exist in the solenoid coil 104. Use of the first flip-flop 204 allows the circuitry 100 to have "memory" in that the circuitry 100 is operable to disable current from flowing through the solenoid coil 104 if an over-current condition was detected at any time during the previous 160 microsecond time window. If such an over-current condition exists, the circuitry 100 of the present invention disables current from flowing through the solenoid coil 104 at the end of the first 40 microsecond period during the 160 microsecond time window following the previous 160 microsecond time window in which the over-current condition was detected.

Conversely, if no over-current condition was detected during the previous 160 microsecond time window, the circuitry 100 of the present invention allows current to flow through the solenoid coil 104 after the end of the 40 microsecond beginning of the following 160 microsecond time period.

During the entire time that the circuitry 100 is operating as described hereinbefore in its normal manner, the timing circuitry 248 provides a logic HI on the signal line 252 connected to the third input of the three-input AND gate 208. The timing circuitry 248 disables the flow of current through the solenoid coil 104 at a predetermined time interval such that a check for an open solenoid coil 104 can be carried out. In the preferred, yet exemplary, embodiment of the present invention, the timing circuitry 248 counts a total of 64 of the 160 microsecond time windows, for a total time period of 10.24 milliseconds. During the final 40 microseconds of the 64th time window, the timing circuitry 248 provides a logic LO level on the third input of the three-input AND gate 208. During this 40 microsecond time period, the timing circuitry 248 provides address and control signals on a bus 268 that is connected to a pair of demultiplexer circuits 272, 276, along with the multiplexer 156. The timing circuitry 248 provides the proper address for the multiplexer 156 to select the feedback or wraparound signal 280 from the high side ("HI W/A") of the solenoid coil 104. This voltage signal 280 is passed through the multiplexer 156 on to the output of the multiplexer 156 on a signal line 284. The multiplexer output 284 is fed to the inverting input of an operational amplifier configured as a comparator 288. A reference voltage, VREF, is connected to the non-inverting input of this comparator 288. If an open-coil condition exists, the voltage at the inverting input of the comparator 288 is less than the reference voltage at the non-inverting input of the comparator 288. Then, the comparator output on a signal line 292 is a logic HI. On the other hand, if no open-coil condition exists (i.e, the solenoid 104 is functioning properly), the output of the comparator 288 on the line 292 is a logic LO.

At the same time that the timing circuitry 248 instructs the multiplexer to 156 select the high wraparound signal 280, HI W/A, the timing circuitry 248 addresses the upper demultiplexer 272, which comprises a multiple bit shift register. The comparator output on the line 292 is shifted into the upper demultiplexer 272. The demultiplexer 272 contains a plurality of bits, each bit being dedicated to one of a plurality of both high and low wraparound signals ("HI W/A" 280, "LO W/A" 296) from a plurality of circuits similar to the circuitry 100 of the present invention. The contents of the demultiplexer shift register 272 are presented in parallel at the output of the demultiplexer. The parallel signals are fed to an "off" register 300 that is readable by the CPU 216. This register 300 is referred to as an "off" register 300 since it stores the state of the solenoid coil 104 during the time in which current has been disabled from flowing through the solenoid 104 (i.e., the "off" state of the solenoid).

In a similar manner, during the aforementioned 40 microsecond time period at the end of the 64th 160 microsecond window, the timing circuitry 248 instructs the multiplexer 156 to pass the low wraparound signal 296, LO W/A, to the multiplexer output on the signal line 284, where it is compared to the reference voltage by the comparator 288. In a similar manner, if an open-coil condition exists, the output of the comparator 288 is a logic HI. On the other hand, if the solenoid 104 is functioning properly, the output of the comparator 288 is a logic LO. Regardless, the state of the comparator 288 is shifted into the upper demultiplexer 272, and eventually into the "off" register 300.

At some point in time during the 10.24 millisecond time period that comprises 64 of the 160 microsecond windows, the timing circuitry 248 will instruct the multiplexer 156 to pass the voltage level on the high wraparound signal 280 and the voltage level on the low wraparound signal 296 (not simultaneously, however) to be checked against the reference voltage in the comparator 288. The timing circuitry 248 carries this out typically during the first 40 microsecond period of any window in which it is known that the solenoid 104 is on. This test represents a "voltage on" check of the solenoid voltage. The timing circuitry 248 will address the lower demultiplexer 276 to shift the results of these two wraparound tests through the demultiplexer 276 and into the "on" register 304, which is also readable by the CPU 216.

The circuitry 100 of the present invention also includes high side interface circuitry 136 disposed on the solenoid interface integrated circuit 140, together with high side control circuitry 144 disposed on the gate array 124; both circuits 136, 144 controlling the upper or "high" side of the solenoid 104. The high side control circuitry 144 may comprise a solenoid enable register that is similar to the aforementioned register 224 used in control of the low side of the solenoid 104. The output of the high side control circuitry 144 is fed to the high side interface circuitry 136, which may comprise a comparator whose two inputs are connected across the upper sense resistor 132.

If an over-current condition exists in the solenoid 104 on the high side, the voltage differential across this upper sense resistor 132 exceeds a predetermined value and shuts off the upper transistor 128 by providing a logic LO voltage level on the gate terminal of this transistor 128. Otherwise, during proper operation of the solenoid 104, the voltage across the upper sense resistor 132 does not exceed the over-current threshold, and the second transistor 128 is on, allowing current to pass through the solenoid 104.

In contrast to the circuitry that controls the low side of the solenoid, the circuitry that controls the upper side of the solenoid does not have to operate in a pulse width modulated mode. That is, it may simply operate in a DC mode. It is to be understood that the high side control circuitry 144 and the high side interface circuitry 136 may comprise well-known circuitry, and it forms no part of the broadest scope of the present invention. Further, such circuitry may be eliminated from any control scheme, such that the upper side of the solenoid coil 104 is connected directly to the voltage supply 108.

The pulse width modulated electronic drive circuitry 100 of the present invention has been described for use in controlling the low side of the solenoid coil. However, this is purely exemplary; the circuitry may be connected, instead, to the upper or high side of the solenoid coil 104. Further, the specific components described and illustrated for carrying out the specific functions of the circuitry 100 of the present invention are purely exemplary, it is to be understood that other components may be utilized in light of the teachings herein. Such components should be obvious to one of ordinary skill in the art. Also, the length of the repetitive time "windows" is purely exemplary, along with the 25/75 percent division of each window.

It should be understood by those skilled in the art that obvious structural modifications can be made without departing from the spirit of the invention. Accordingly, reference should be made primarily to the accompanying claims, rather than the foregoing specification, to determine the scope of the invention.

Having thus described the invention, what is claimed is:

1. Circuitry for interfacing with a solenoid, comprising:
   a. switching means for selectively enabling an electrical current to flow through the solenoid;
   b. sensing means for sensing an amount of the electrical current flowing through the solenoid, and for providing a sensed current signal indicative thereof;
   c. comparing means for comparing the sensed current signal with a reference current signal indicative of a predetermined amount of the electrical current flowing through the solenoid, and for providing a comparison signal indicative of a result of the comparing, wherein if the sensed current signal is greater than the reference current signal an over-current condition exists such that an excessive amount of the electrical current is flowing through the solenoid, and wherein if the sensed current signal is less than the reference current signal an over-current condition does not exist such that there is not an excessive amount of the electrical current flowing through the solenoid; and d. signal processing means for enabling the switching means to enable the electrical current to flow through the solenoid for a first predetermined period of time during each of a plurality of repetitive time windows regardless of whether an over-current condition exists, a length of time of each of the repetitive time windows being greater than the first predetermined period of time such that a second predetermined period of time exists in each of the repetitive time windows, the second predetermined period of time being an amount of time not occupied by the first predetermined period of time, the signal processing means further comprising means, responsive to the comparison signal, for enabling the switching means to enable the electrical current to flow through the solenoid during the second predetermined period of time in one of the repetitive time windows if the over-current condition does not exist at any time during the repetitive time window that precedes the one of the repetitive time windows, and for disabling the switching means to disable the electrical current from flowing through the solenoid during the second predetermined period of time in one of the repetitive time windows if the over-current condition exists at any time during the repetitive time window that precedes the one of the repetitive time windows.

2. The interface circuitry of claim 1, wherein the signal processing means further comprises means for sensing an open-coil condition of the solenoid.

3. The interface circuitry of claim 2, wherein the means for sensing an open-coil condition of the solenoid comprises means for disabling the switching means to disable the electrical current from flowing through the solenoid for a third predetermined period of time that occurs during one of the repetitive time windows that occurs after a predetermined number of the repetitive time windows has transpired, and comprises means for sensing an open-coil condition of the solenoid during the third predetermined period of time.

4. The interface circuitry of claim 3, wherein the means for sensing an open-coil condition of the solenoid during the third predetermined period of time comprises means for comparing a voltage on an end of the solenoid with a reference solenoid voltage indicative of a voltage value of an open solenoid coil, and for providing a result signal indicative of the result of the comparing, wherein if the voltage on an end of the solenoid is less than the reference solenoid voltage an open-coil condition exists in the solenoid, and wherein if the voltage on an end of the solenoid is greater than the reference solenoid voltage then an open-coil condition does not exist in the solenoid.

5. The interface circuitry of claim 1, wherein the signal processing means further comprises means for enabling the switching means to enable electrical current to flow through the solenoid for a fourth predetermined period of time upon a current of a certain one or more conditions, the fourth predetermined period of time being independent of the plurality of repetitive time windows.

6. The interface circuitry of claim 1, wherein the switching means comprises a transistor connected in a series electrical connection with the solenoid.

7. The interface circuitry of claim 1, wherein the sensing means comprises a resistor connected in a series electrical connection with the solenoid, the sensed current signal being a voltage across the resistor.

8. The interface circuitry of claim 1, further comprising filter means, responsive to the comparison signal, for disabling the signal processing means to disable the switching means to disable the electrical current from flowing through the solenoid during the second predetermined period of time in one of the repetitive time windows if the over-current condition exists for a predetermined amount of time at any time during the repetitive time window that precedes the one of the repetitive time windows.

9. The interface circuitry of claim 1, wherein the first predetermined period of time is at a start of each one of the repetitive time windows, and wherein the second predetermined period of time begins at an end of the first predetermined period of time and continues to an end of the corresponding one of the repetitive time window.

* * * * *